(12) United States Patent
Han

(10) Patent No.: US 11,277,102 B2
(45) Date of Patent: Mar. 15, 2022

(54) POWER AMPLIFIER MODULE WITH TEMPERATURE COMPENSATION

(71) Applicant: Samsung Electro-Mechanics Co., Ltd., Suwon-si (KR)

(72) Inventor: Su Yeon Han, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 18 days.

(21) Appl. No.: 16/841,588

(22) Filed: Apr. 6, 2020

(65) Prior Publication Data

US 2021/0194436 A1 Jun. 24, 2021

(30) Foreign Application Priority Data

Dec. 23, 2019 (KR) .................. 10-2019-0172975

(51) Int. Cl.
*H03F 3/04* (2006.01)
*H03F 1/30* (2006.01)
*H03F 3/21* (2006.01)
*H03F 1/02* (2006.01)

(52) U.S. Cl.
CPC ........... *H03F 1/302* (2013.01); *H03F 1/0211* (2013.01); *H03F 3/21* (2013.01); *H03F 2200/447* (2013.01); *H03F 2200/451* (2013.01); *H03F 2200/468* (2013.01); *H03F 2200/471* (2013.01)

(58) Field of Classification Search
CPC .......... H03F 1/302; H03F 1/0211; H03F 3/21; H03F 2200/468; H03F 2200/451; H03F 2200/471; H03F 2200/447; H03F 2200/18; H03F 1/301; H03F 1/0261; H03F 1/30; H03F 1/307; H03F 3/26; H03G 3/3042; H03G 3/3047
USPC ............................... 330/272, 285, 296, 289
See application file for complete search history.

(56) References Cited

U.S. PATENT DOCUMENTS

| | | | | |
|---|---|---|---|---|
| 7,656,233 B2* | 2/2010 | Lee | ......................... | H03F 1/301 330/289 |
| 7,994,862 B1* | 8/2011 | Pukhovski | .............. | H03F 3/211 330/289 |
| 8,183,928 B2* | 5/2012 | Kim | ........................ | H03F 1/303 330/289 |
| 9,698,734 B2* | 7/2017 | Lehtola | ..................... | H03F 3/24 |
| 10,153,737 B2* | 12/2018 | Ishihara | .................. | H03F 3/213 |
| 11,038,472 B2* | 6/2021 | Scott | ........................ | H03F 3/245 |
| 2018/0241349 A1 | 8/2018 | Ishihara et al. | | |

FOREIGN PATENT DOCUMENTS

KR 10-2018-0095440 A 8/2018

* cited by examiner

*Primary Examiner* — Khanh V Nguyen
(74) *Attorney, Agent, or Firm* — NSIP Law

(57) ABSTRACT

A power amplifier module includes a power amplifier including an amplifier including an amplifying transistor configured to amplify an input signal, and output an output signal, and a bias circuit including a bias transistor configured to provide a bias current to the amplifying transistor; and a controller configured to provide a control current to the bias transistor, wherein the controller is configured to vary the control current based on a temperature of the amplifying transistor.

14 Claims, 3 Drawing Sheets

POWER AMPLIFIER MODULE WITH TEMPERATURE COMPENSATION

CROSS-REFERENCE TO RELATED APPLICATIONS

This application claims the benefit under 35 USC § 119(a) of Korean Patent Application No. 10-2019-0172975 filed on Dec. 23, 2019 in the Korean Intellectual Property Office, the entire disclosure of which is incorporated herein by reference for all purposes.

BACKGROUND

1. Field

The following description relates to a power amplifier module.

2. Description of Related Art

Mobile communication terminals such as cellular phones, or similar devices, employ a power amplifier module that amplifies a radio frequency (RF) signal to be transmitted to a base station. The power amplifier module includes an amplifier that amplifies an RF signal and a bias circuit that controls a bias point of the amplifier.

However, when a voltage between a base and an emitter of an amplifying transistor constituting the amplifier is constantly driven, a temperature of the amplifying transistor may increase. When the amplifying transistor operates at a temperature higher than a normal temperature range, since a gain of the amplifying transistor tends to decrease rapidly from a turn-on time to a turn-off time of the amplifying transistor, the amplification efficiency of the amplifying transistor may be lowered significantly.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a power amplifier module includes a power amplifier including an amplifier including an amplifying transistor configured to amplify an input signal, and output an output signal, and a bias circuit including a bias transistor configured to provide a bias current to the amplifying transistor; and a controller configured to provide a control current to the bias transistor, wherein the controller is configured to vary the control current based on a temperature of the amplifying transistor.

The controller may include a detection voltage output device configured to output a detection voltage corresponding to the temperature of the amplifying transistor.

The detection voltage output device may include a sensing transistor that is thermally coupled to the amplifying transistor.

A collector, a base, and an emitter of the sensing transistor may be connected in a diode connection form.

The detection voltage output device may be configured to output a voltage between the collector, base, and the emitter of the sensing transistor as the detection voltage.

The detection voltage may decrease as the temperature of the amplifying transistor increases.

The detection voltage output device may further include a current source that provides a reference current to the sensing transistor.

The detection voltage output device may further include a filtering capacitor configured to filter high frequency components of the output signal input to the sensing transistor.

The controller may further include a temperature determinator configured to determine the temperature of the amplifying transistor based on the detection voltage.

The controller may further include a control current generator configured to generate the control current based on the temperature of the amplifying transistor.

The control current generator may be configured to increase a level of the control current when the temperature of the amplifying transistor is higher than a reference temperature.

The controller may further include a control current generator configured to generate the control current based on the detection voltage.

The control current generator may be configured to increase a level of the control current when the detection voltage is lower than a reference voltage.

In a general aspect, an amplifier module includes an amplifier comprising an amplifying transistor; and a bias circuit comprising a temperature compensator; and a controller, configured to detect a temperature of the amplifying transistor; wherein the temperature compensator is configured to generate a compensation voltage based on a detected increase in the temperature of the amplifying transistor.

The controller may be configured to vary a control current based on the detected temperature.

The amplifier may further include a sensing transistor that is thermally connected to the amplifying transistor, and may be configured to sense the temperature of the amplifying transistor.

Other features and aspects will be apparent from the following detailed description, the drawings, and the claims.

Figure 1:
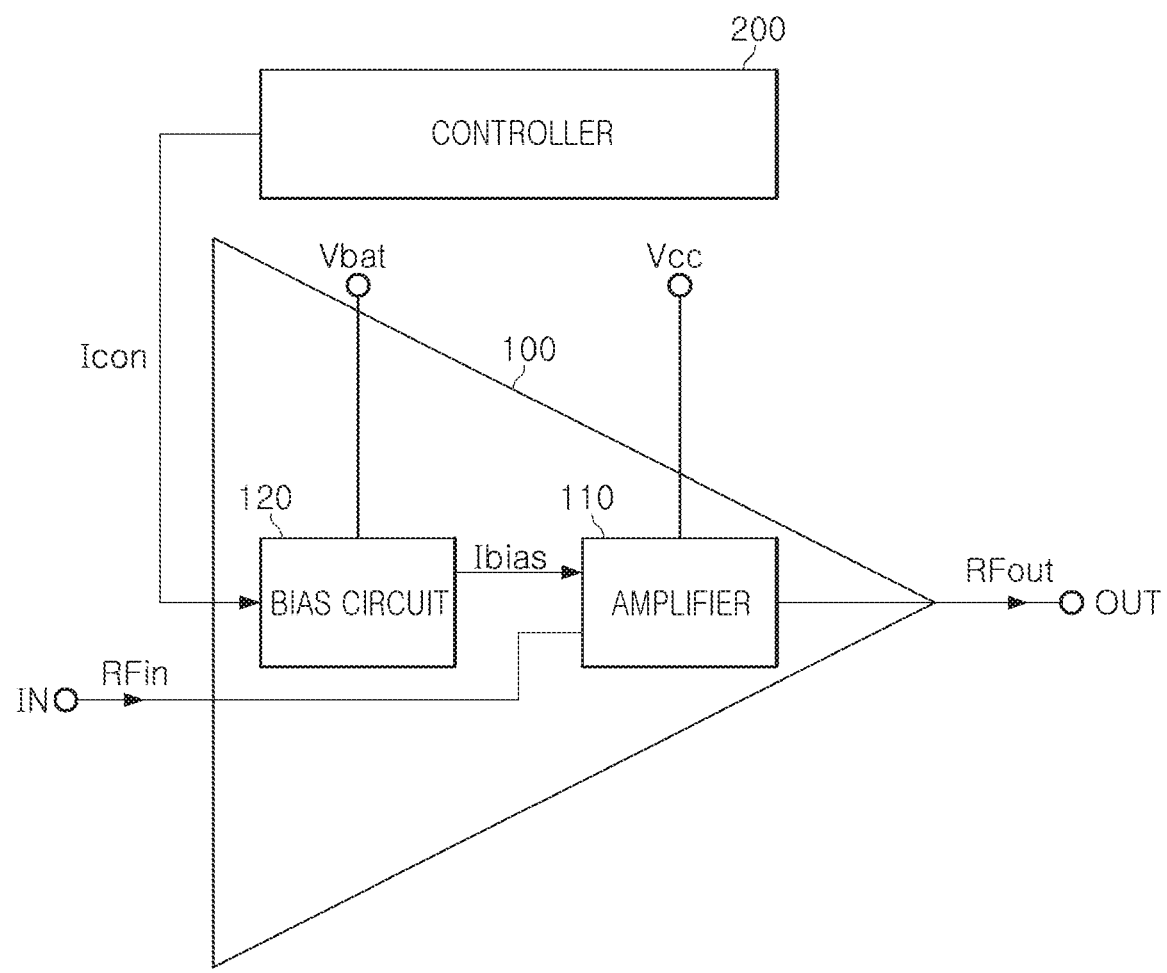
FIG. 1 illustrates an example of a power amplifier module, in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains after an understanding of the disclosure of this application. Terms, such as those defined in commonly used dictionaries, are to be interpreted as having a meaning that is consistent with their meaning in the context of the relevant art and the disclosure of the present application, and are not to be interpreted in an idealized or overly formal sense unless expressly so defined herein.

FIG. 1 illustrates block diagram of an example power amplifier module, in accordance with one or more embodiments.

Referring to FIG. 1, a power amplifier module 10 includes, as non-limiting examples, a power amplifier 100 and a controller 200.

The power amplifier 100 may amplify an input signal RFin input through an input terminal IN according to a control current Icon to generate an output signal RFout, and may output the generated output signal RFout through an output terminal OUT.

In a non-limiting example, the power amplifier 100 may output the output signal RFout by amplifying a power of the input signal RFin to a level necessary for transmitting the power to a base station. The output terminal OUT of the power amplifier 100 may be connected to a predetermined antenna or a plurality of predetermined antennas, and the output signal RFout may be transmitted externally through an antenna.

The power amplifier 100 may be driven by receiving a first driving voltage Vcc and a second driving voltage Vbat from a predetermined terminal. Hereinafter, for convenience of description, terminals for supplying the first driving voltage Vcc and the second driving voltage Vbat are referred to as a first driving voltage (Vcc) terminal and a second driving voltage (Vbat) terminal, respectively.

The power amplifier 100 may include an amplifier 110 that amplifies an input signal RFin and a bias circuit 120 that generates a bias current Ibias according to the control current Icon provided from the controller 200 and providing the generated bias current Ibias to the amplifier 110. The amplifier 110 may be connected to the first driving voltage (Vcc) terminal, and the bias circuit 120 may be connected to a second driving voltage (Vbat) terminal.

In FIG. 1, it is illustrated that, in a non-limiting example, the power amplifier 100 includes one amplifier 110. However, in an example, the power amplifier 100 may include a plurality of amplifiers 110 connected in multiple stages, and the plurality of amplifiers 110 connected in multiple stages may sequentially amplify the input signal RFin to generate the output signal RFout. For example, a matching circuit may be provided between the plurality of amplifiers 110 connected in multiple stages, and an impedance between the amplifier in a front end and an amplifier unit in a rear end may be matched.

According to an example, a base band integrated circuit (IC) that generates a base band signal and an RF IC that modulates the base band signal into an input signal RFin may be provided in a front end of the input terminal IN of the power amplifier 100. The base band IC may encode and modulate communication information according to a predetermined communication method, and generate a base band signal by digital signal processing. The RF IC may modulate a carrier according to information superimposed on the base band signal to generate an input signal RFin.

The controller 200 may provide a control current Icon to the power amplifier 100. The controller 200 may vary the control current Icon provided to the power amplifier 100 according to a temperature of an amplifying transistor provided in the amplifier 110.

Figure 2:
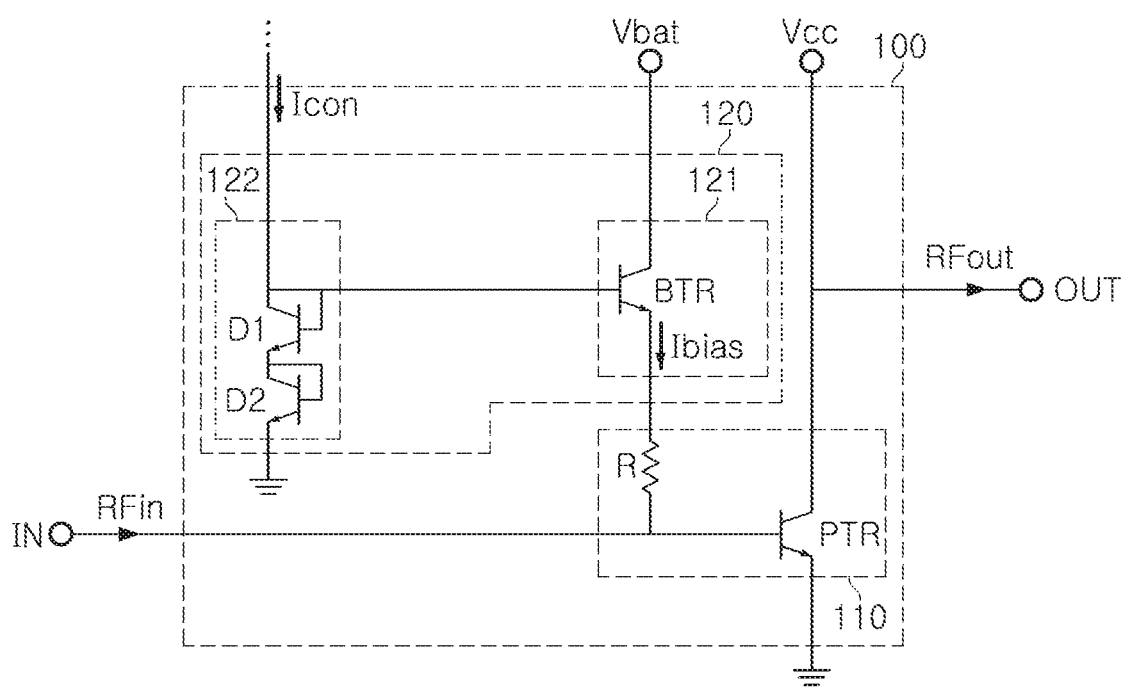
FIG. 2 illustrates an example of a detailed circuit diagram of an example power amplifier, accordance with one or more embodiments.

FIG. 2 is a detailed circuit diagram of an example power amplifier, in accordance with one or more embodiments. Referring to FIG. 2, the power amplifier 100 may correspond to the power amplifier illustrated in FIG. 1, and may include an amplifier 110 and a bias circuit 120.

The amplifier 100 may amplify an input signal RFin input through an input terminal IN according to a bias current Ibias provided from the bias unit 120 to generate an output signal RFout. The generated output signal RFout may be output through an output terminal OUT.

The amplifier 110 may include an amplifying transistor PTR of an emitter ground type. A base of the amplifying transistor PTR is connected to the input terminal IN, and the input signal RFin is input to the base of the amplifying transistor PTR. In some embodiments, the base of the amplifying transistor PTR may be connected to the input terminal IN through a predetermined capacitor.

Additionally, the base of the amplifying transistor PTR may be connected to an emitter of the bias transistor BTR, such that a bias current Ibias may be input. According to an embodiment, the base of the amplifying transistor PTR may be connected to the emitter of the bias transistor BTR through a predetermined ballast resistor R.

A collector of the amplifying transistor PTR may be connected to the output terminal OUT, and may output an output signal RFout. In an embodiment, the collector of the amplifying transistor PTR may be connected to the output terminal OUT through a predetermined capacitor.

Additionally, the collector of the amplifying transistor PTR may be connected to a first driving voltage (Vcc) terminal. In some embodiments, the collector of the amplifying transistor PTR is connected to the first driving voltage (Vcc) terminal through a predetermined inductor.

The amplifying transistor PTR may amplify the input signal RFin input through the input terminal IN according to the bias current Ibias, and may output the output signal RFout through the output terminal OUT.

A bias circuit 120 may include a bias current generator 121 and a temperature compensator 122.

The bias current generator 121 may generate a bias current Ibias according to the control current Icon provided from the controller 200, and provide the generated bias current Ibias to the amplifier 110.

The bias current generator 121 may include a bias transistor BTR that generates the bias current Ibias according to the control current Icon.

A base of the bias transistor BTR may be connected to the controller 200, and a control current Icon may be input to the base of the bias transistor BTR. The collector of the bias transistor BTR may be connected to a second driving voltage (Vbat) terminal.

Additionally, an emitter of the bias transistor BTR may be connected to a base of the amplifying transistor PTR through a predetermined ballast resistor R to provide a bias current Ibias.

When the amplifying transistor PTR is driven such that a voltage between the base and the emitter is constant, a collector current increases as the temperature increases. When a power consumption increases due to an increase in the collector current, the temperature of the amplifying transistor PTR increases, and a thermal runaway phenomenon in which the collector current further increases occurs.

In order to prevent the thermal runaway phenomenon described above, a temperature compensator 122 may be provided between the base of the bias transistor BTR and a ground.

The temperature compensator 122 may include, as non-limiting examples, diodes D1 and D2 connected in series. For example, each of the at least one diode D1 and D2 may include a diode connection transistor. Each of the diode connection transistors may be connected in such a manner that the collector and the base are connected to each other.

The at least one diode D1 and D2 of the temperature compensator 122 generates a temperature compensation voltage according to the control current Icon provided from the controller 200. Since the temperature compensation voltage of the at least one diode D1 and D2 falls as the temperature increases, the base voltage of the bias transistor BTR falls as the temperature increases. Accordingly, thermal runaway of the amplifying transistor PTR may be prevented, and problems related to a thermal runaway phenomenon that may affect the performance of the amplifying transistor PTR may be resolved.

However, even when the thermal runaway phenomenon of the amplifying transistor PTR is suppressed by the temperature compensator 122, when the amplifying transistor PTR operates at a temperature higher than the normal temperature range, since the amplification gain of the amplifying transistor PTR may decrease rapidly from the turn-on time to the turn-off time of the amplifying transistor PTR, the amplification efficiency may be lowered significantly.

The controller 200 of the power amplification module 10 according to an example may detect the temperature of the amplifying transistor PTR, and vary the control current Icon according to the detected temperature of the amplifying transistor PTR to compensate the amplification gain of the amplifying transistor PTR.

Figure 3:
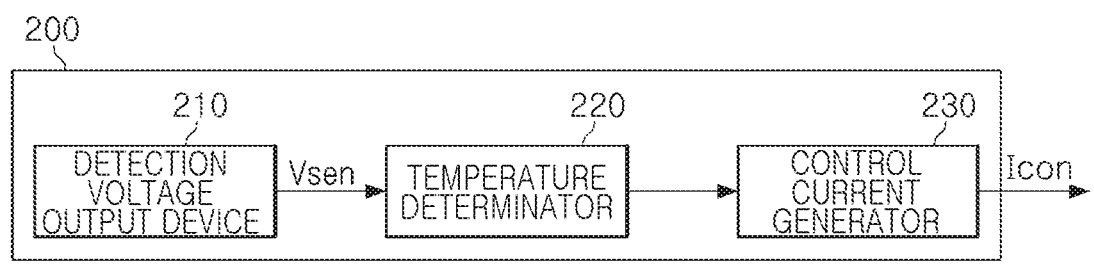
FIG. 3 illustrates a block diagram of an example controller, in accordance with one or more embodiments.
Figure 4:
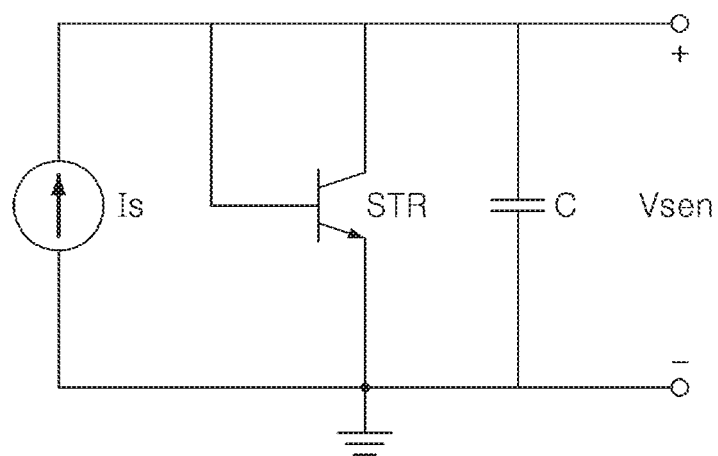
FIG. 4 illustrates a circuit diagram of an example detection voltage output device, in accordance with one or more embodiments.

FIG. 3 is a block diagram of an example controller, in accordance with one or more embodiments, and FIG. 4 is an example circuit diagram of a detection voltage output circuit, in accordance with one or more embodiments.

Referring to FIG. 3, a controller 200 includes a detection voltage output device 210, a temperature determinator 220, and a control current generator 230.

The detection voltage output device 210 may output a detection voltage corresponding to a temperature of an amplifying transistor PTR.

Referring to FIG. 4, the detection voltage output device 210 may include, as non-limiting examples, a sensing transistor STR and a current source Is, and may further include a filtering capacitor C.

The sensing transistor STR may be connected in a form of a diode connection in which an emitter is connected to a ground, and a collector and a base are connected to each other, and thus may function as a predetermined diode element. For example, the emitter of the sensing transistor STR may correspond to a cathode of the diode element, and the collector and the base of the sensing transistor STR may correspond to an anode of the diode element.

The current source Is may provide a reference current to the sensing transistor STR. For example, the current source Is may provide a reference current to the collector and the base of the sensing transistor STR. On the basis of the reference current provided from the current source Is, the detection voltage Vsen may be output at both ends between the collector/base and the emitter of the sensing transistor STR.

A first end of the filtering capacitor C may be connected to the collector/base of the sensing transistor STR, and a second end of the filtering capacitor C may be connected to the emitter of the sensing transistor STR. The filtering capacitor C may filter high frequency components of the output signal RFout input to the sensing transistor STR.

The sensing transistor STR may be thermally coupled to the amplifying transistor PTR. The sensing transistor STR may be disposed to be adjacent to the amplifying transistor PTR. In a non-limiting example, the sensing transistor STR may be disposed to be spaced apart by 100 µm to 200 µm from the amplifying transistor PTR.

Since the sensing transistor STR is thermally coupled to the amplifying transistor PTR, when the temperature of the amplifying transistor PTR increases, the temperature of the sensing transistor STR may also increase.

Since a forward voltage of the sensing transistor STR in the form of the diode connection has a temperature characteristic that decreases as the temperature increases, the detection voltage Vsen may decrease as the temperature of the amplifying transistor PTR increases.

The temperature determinator 220 may determine the temperature of the amplifying transistor PTR based on the detection voltage Vsen. For example, the temperature determinator 220 may include data in a form of a look-up table for the detection voltage Vsen, and the temperature of the amplifying transistor PTR, and the temperature of the amplifying transistor PTR may be determined based on a level of the detection voltage Vsen.

The control current generator 230 may generate a control current Icon according to the temperature of the amplifying transistor PTR determined by the temperature determinator 220.

As described above, when the amplifying transistor PTR is operated at a temperature higher than the normal temperature range, an amplification gain of the amplifying transistor PTR tends to decrease rapidly from a turn-on time to a turn-off time of the amplifying transistor PTR.

When the temperature of the amplifying transistor PRT is higher than the reference temperature, a level of the control current Icon may be increased to compensate for the reduced amplification gain. When the level of the current control Icon increases, the bias current Ibias increases, and the amplification gain of the amplifying transistor PTR may be compensated.

In the above-described example, it is illustrated that the controller 200 may include a detection voltage output device 210, a temperature determinator 220, and a control current generator 230. However, in an example, the controller 200 may include the detection voltage output device 210 and the control current generator 230.

In this example, the control current generator 230 of the controller 200 may generate a control current Icon according to the detection voltage Vsen. For example, when the detection voltage Vsen is lower than the reference voltage, the control current generator 230 may increase the level of the control current Icon to compensate the reduced amplification gain. When the level of the control current Icon increases, the bias current Ibis increases, and the amplification gain of the amplifying transistor PTR may be compensated.

As set forth above, according to an example, a control current may be varied based on a detection voltage of a sensing transistor that is thermally coupled to an amplifying transistor to compensate for an amplification gain of the amplifying transistor that decreases as the temperature increases.

Although the examples have been described by specific embodiments such as specific components and the like, the embodiments and the drawings are provided to assist in a more general understanding of the present disclosure. The present disclosure is not limited to the above embodiments. For those skilled in the art, various modifications and variations can be made from these descriptions.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power amplifier module, comprising:
a power amplifier including an amplifier comprising an amplifying transistor configured to amplify an input signal, and output an output signal, and a bias circuit comprising a bias transistor configured to provide a bias current to the amplifying transistor; and
a controller configured to provide a control current to the bias transistor,
wherein the controller is configured to vary the control current based on a temperature of the amplifying transistor, such that the control current increases when the temperature of the amplifying transistor is higher than a reference temperature.

2. The power amplifier module of claim 1, wherein the controller comprises a detection voltage output device configured to output a detection voltage corresponding to the temperature of the amplifying transistor.

3. The power amplifier module of claim 2, wherein the detection voltage output device comprises a sensing transistor that is thermally coupled to the amplifying transistor.

4. The power amplifier module of claim 3, wherein a collector, a base, and an emitter of the sensing transistor are connected in a diode connection form.

5. The power amplifier module of claim 4, wherein the detection voltage output device is configured to output a voltage between the collector, base, and the emitter of the sensing transistor as the detection voltage.

6. The power amplifier module of claim 5, wherein the detection voltage decreases as the temperature of the amplifying transistor increases.

7. The power amplifier module of claim 3, wherein the detection voltage output device further comprises a current source that provides a reference current to the sensing transistor.

8. The power amplifier module of claim 3, wherein the detection voltage output device further comprises a filtering capacitor configured to filter high frequency components of the output signal input to the sensing transistor.

9. The power amplifier module of claim 2, wherein the controller further comprises a temperature determinator configured to determine the temperature of the amplifying transistor based on the detection voltage.

10. The power amplifier module of claim 9, wherein the controller further comprises a control current generator configured to generate the control current based on the temperature of the amplifying transistor.

11. The power amplifier module of claim 2, wherein the controller further comprises a control current generator configured to generate the control current based on the detection voltage.

12. A power amplifier module, comprising:
a power amplifier including an amplifier comprising an amplifying transistor configured to amplify an input signal, and output an output signal, and a bias circuit comprising a bias transistor configured to provide a bias current to the amplifying transistor; and
a controller configured to provide a control current to the bias transistor,
wherein the controller is configured to vary the control current based on a temperature of the amplifying transistor,
wherein the controller comprises a detection voltage output device configured to output a detection voltage corresponding to the temperature of the amplifying transistor, and a control current generator configured to generate the control current based on the detection voltage, and wherein the control current generator is configured to increase a level of the control current when the detection voltage is lower than a reference voltage.

13. An amplifier module comprising:
an amplifier comprising an amplifying transistor; and
a bias circuit comprising a temperature compensator; and
a controller configured to detect a temperature of the amplifying transistor, and vary a control current based on the detected temperature such that the control current increases when the detected temperature is higher than a reference temperature,
wherein the temperature compensator is configured to generate a compensation voltage based on the control current.

14. The amplifier module of claim 13, wherein the amplifier further comprises a sensing transistor that is thermally connected to the amplifying transistor, and is configured to sense the temperature of the amplifying transistor.

* * * * *